LOGICAL CIRCUIT ELEMENT COMPRISING A MOS FIELD EFFECT TRANSISTOR

Filed Nov. 30, 1966 5 Sheets-Sheet 1

United States Patent Office 3,521,081
Patented July 21, 1970

3,521,081
LOGICAL CIRCUIT ELEMENT COMPRISING AN MOS FIELD EFFECT TRANSISTOR

Jean-Pierre Vasseur and Alexandre Sev, Paris, France, assignors to CSF-Compagnie Generale de Telegraphie Sans Fil, a corporation of France Filed Nov. 30, 1966, Ser. No. 597,934
Claims priority, application France, Dec. 3, 1965, 40,877
Int. Cl. H03k *19/08*
U.S. Cl. 307—205 12 Claims

ABSTRACT OF THE DISCLOSURE

A logical circuit element comprises at least one field effect transistor of the metal oxide semiconductor (MOS) type. An input connected to a two-level-voltage D.C. supply is connected to its gate, and an input capacitor is series connected between the input and the source. For a first level the transistor is blocked, for the other it is unblocked. An output is connected to the drain. An output capacitor is series connected between the drain and the source. A pulse generator is connected to the output capacitor. It charges or not the output capacitor, according the level of the voltage applied to the input. A diode prevents any discharge of the output capacitor across the MOS element.

The present invention relates to transistorized logical circuit elements.

According to the invention there is provided a logical circuit comprising at least one field effect transistor of the metal oxide semiconductor (MOS) type, having a source, a drain and a gate; an input for receiving signals connected to said gate, for blocking or unblocking said transistor; an input capacitor connected between said input and said source, and an output impedance connected in series between said source and said drain.

For a better understanding of the invention, reference will be made to the drawings accompanying the following description and in which:

FIG. 1 shows a field effect element with insulated gate of the type sometimes referred to as the MOS (metal oxide semiconductor) field effect transistor. The gate of the element is grounded through a capacitor $C_1$.

The source-drain circuit is mounted in series with a capacitor $C_2$, a diode $D_1$ and a pulse generator G.

The operation of the circuit is based on the following properties of MOS devices:

(a) The grid biasing consumes practically no energy, the grid leak being of the order of $10^{14}$ ohms. If a low capacitance capacitor $C_1$ is connected between gate and earth, the same will not be discharged after the disappearance of the gate voltage $V_g$. It holds the memory of the voltage $V_g$ for a long period.

(b) The MOS element operates as an interrupter.

In the state corresponding to the presence of a given gate voltage $V_1$, the conductivity of the source-drain circuit is of the order of 1 millimho.

In the so-called "blocked" state, corresponding to the presence of a given gate voltage $V_2$, the conductivity of the drain-source is reduced to $10^{-8}$ mho.

Figure 1:
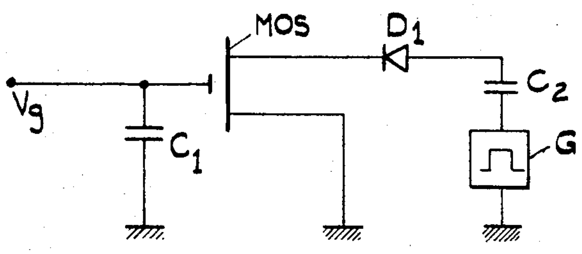
FIG. 1 represents the basic element of a circuit according to the invention.

Thus, the operation of the arrangement of FIG. 1 is as follows:

It is assumed that the gate voltage $V_g$ takes up the two values $V_1$ and $V_2$, corresponding to the two states of a binary logic, voltage $V_1$ corresponding to the normal conduction and the voltage $V_2$ to the blocked state.

The generator G applying a short pulse to the terminals of capacitor $C_2$, two cases have to be examined:

(a) The gate voltage is $V_1$ (capacitor $C_1$ charged to $V_1$). The MOS is conducting. The capacitor $C_2$ is charged through the source-drain circuit to the voltage $V_2$ (pulse amplitude). It will not discharge after the passage of the pulse, because the diode $D_1$ prevents any discharge.

(b) The gate voltage is $V_2$ (capacitor $C_1$ charged to $V_2$). The MOS does not conduct. The capacitor $C_2$ will not be charged.

Thus, once a pulse has been applied by generator G to the MOS element, there are two possible states of charge of the capacitor $C_2$, which respectively correspond to the two states of charge of the capacitor $C_1$. The information stored at the terminals of capacitor $C_1$ is thus transferred to the terminals of capacitor $C_2$.

If $C_1=C_2=C$, the transfer of information has been effected with an expense of energy $W=CV_0^2$ with $V_0=V_1-V_2$, which is very small, and much lower than in transistorized multivibrators.

Naturally, $C_2$ may be replaced by an impedance Z. The same may comprise an element with binary memory X. By means of the arrangement of FIG. 1, the information may be transferred from $C_1$ to X.

Figure 2:
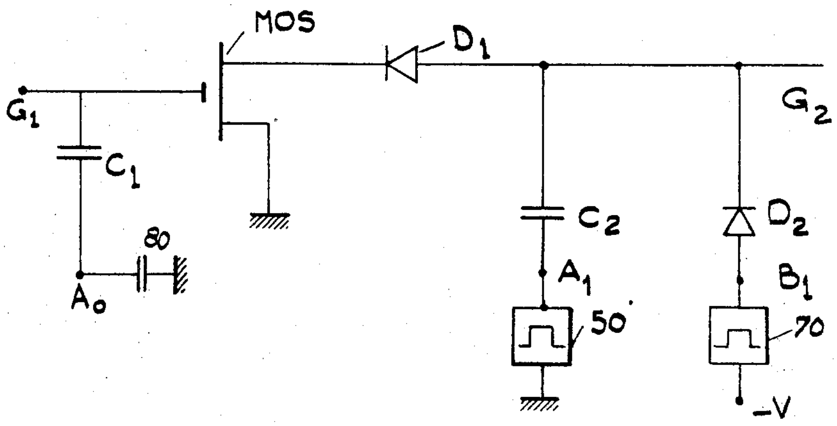
FIGS. 2 and 4 represent inverter elements.

FIG. 2 shows an inverter for a synchronous logical arrangement, derived from the diagram of FIG. 1.

In the following description, it will be assumed that the MOS elements are of the n-type. With p-type element, it is sufficient merely to reverse the sign of the voltages applied and the direction in which the diodes conduct.

$V_1$ will again designate the biasing voltage corresponding to the normal state, and $V_2$ the voltage corresponding to the blocked state.

FIG. 2 shows a "depletion" type MOS element. In other words, it is conducting for $V_1=0$ and blocked for $V_2=-V$.

A capacitor $C_2$, a first generator of positive pulses 50 and a diode $D_1$ are connected, as indicated, in series in the source-drain circuit.

A second positive pulse generator 70, a negative source of D.C. voltage —V and a diode $D_2$ are connected in parallel with the capacitor $C_2$ and the generator 50.

The gate circuit comprises a capacitor $C_1$, whose terminal $A_0$ is connected to a fixed voltage source 80.

The transfer of information is effected from the point $G_1$, where the grid potential is measured, to point $G_2$, the output of the diode $D_1$. The process is a follows:

With the capacitor $C_2$ discharged, the voltage —V is applied at the point $B_1$ to the terminal of the diode $D_2$.

Figure 3:
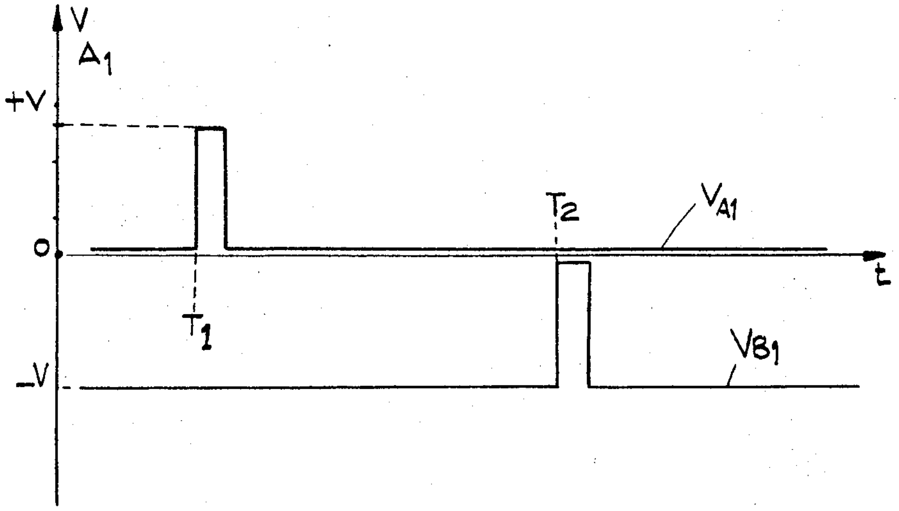
FIGS. 3 and 5 are diagrams explaining FIGS. 2 and 4.

At the moment $T_1$ (FIG. 3), a short positive pulse, whose crest is +V, is applied to the point $A_1$ by the generator 50. Two cases have to be considered:

(a) The potential at $G_1$ is zero, the MOS element is conducting, the capacitor $C_2$ is charged with the voltage +V. At the end of the pulse, the potential at $A_1$ becomes again zero; the voltage at $G_2$ is then equal to —V.

(b) The potential at $G_1$ is equal to —V, the MOS element is not conducting, the capacitor $C_2$ is not charged. At the end of the pulse, the potential at $G_2$ is zero.

The transfer of information from $G_1$ to $G_2$ takes place with changed sign.

A zero voltage at $G_1$ supplies $-V$ at $G_2$.

A $-V$ voltage at $G_1$ gives zero at $G_2$.

The capacitor $C_2$ is discharged, when the generator 70 applies a positive pulse to $B_1$.

Figures 4, 5:
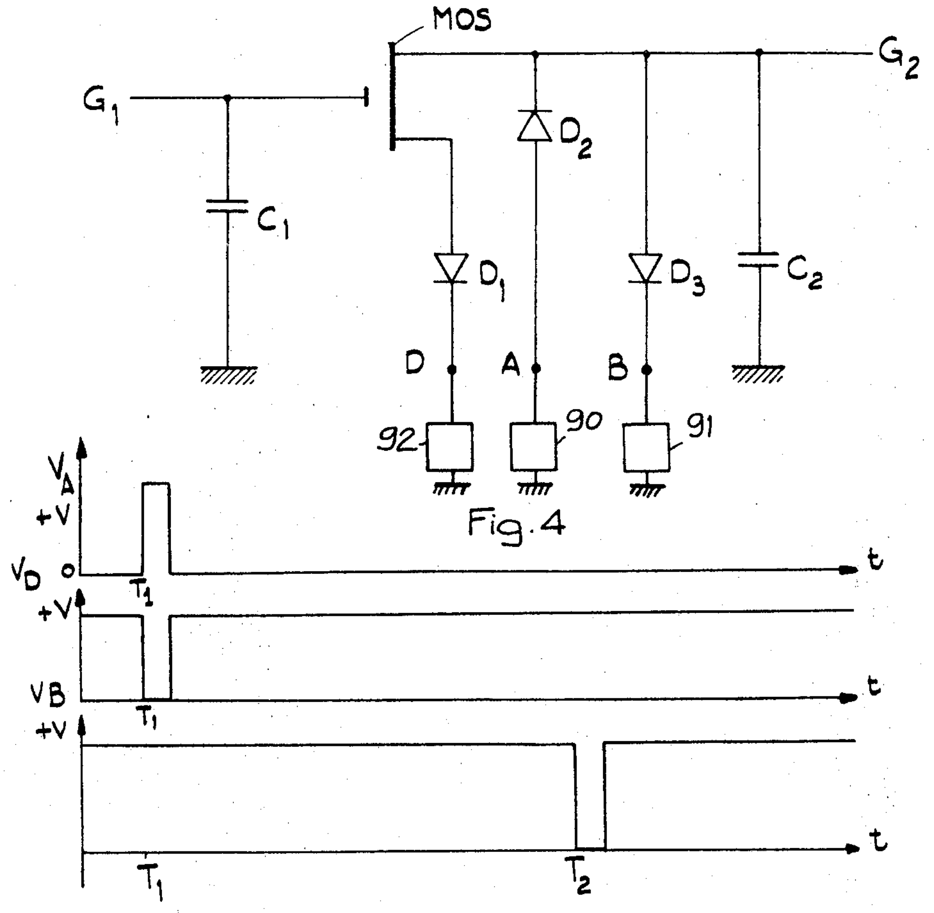

FIG. 4 shows another embodiment of the invention. The MOS element is of the "enhancement" type, wherein the blocking voltage is zero and its conducting voltage is $+V$. The capacitor $C_1$ is mounted between the gate and earth. A diode $D_1$ is mounted in the source circuit and conducts in the direction from the source to point D.

A second diode $D_2$ is mounted in the drain circuit and conducts in the direction from the point A to the drain. Similarly, a third diode $D_3$ is mounted between the drain and the point B and conducts from the drain to point B. The capacitor $C_2$ is mounted between the drain and earth. The information is transmitted from the point $G_1$ (gate) to the point $G_2$ (drain).

FIG. 5 shows the voltages $V_A$, $V_B$, and $V_D$, which are respectively applied to points A, B and D, by pulse generators 90, 91, 92.

The operation of the circuit is as follows: the MOS element is blocked with zero gate potential and unblocked with a potential of $+V$.

The capacitor $C_2$ is discharged. A positive pulse, with a peak value equal to $+V$, is applied at the instant $T_1$ at point A, by pulse generator 90; since the point D is normally at a potential V applied by pulse generator 92, a negative pulse $-V$, synchronized with the former, reduce it to zero.

Two cases are possible:

(a) The potential at point $G_1$ is zero. The MOS element is not conducting. The pulse charges the capacitor $C_2$ through the diode $D_1$ to the potential V. $G_2=V$.

(b) The potential $G_1$ is equal to $+V$. The MOS element is conducting. The capacitor $C_2$ is short-circuited by a weak resistance (that of the MOS element) and is not charged: $G_2=0$.

The diode $D_3$ serves to discharge the capacitor $C_2$ at the end of the cycle by means of a negative pulse which is applied to point B at the time $T_2$.

The elements according to the invention can be grouped in series or in parallel to build up various logical function circuits.

The input impedance of a MOS element is, in fact, formed by a very high resistance in parallel with a weak capacitance.

It follows that several inputs can be coupled in parallel.

Similarly, the output impedance of a blocked MOS element is very high and it is possible to connect without difficulty a large number of output circuits in parallel to a single capacitor.

Figure 6:
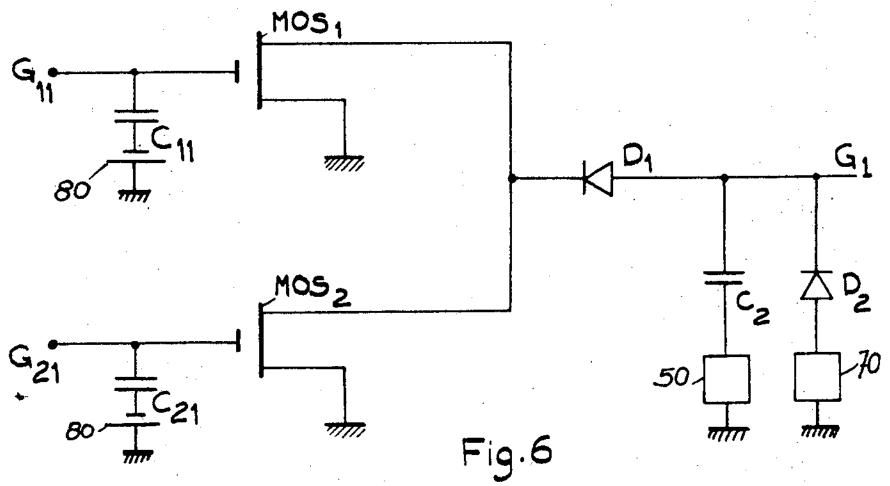
FIGS. 6, 7, 8 and 9, show, respectively NOR, OR, AND and AND-NOT circuits according to the invention.

FIG. 6 shows a circuit which is derived from the circuit shown in FIG. 2.

It comprises two elements $MOS_1$ and $MOS_2$ whose respective drain are connected to the diode $D_1$ and whose sources are connected to earth. Their gates are, respectively, connected to capacitors $C_{11}$, $C_{21}$. The two inputs are at points $G_{11}$, $G_{21}$. The diodes $D_1$, $D_2$ and the capacitor $C_2$ are mounted as shown in FIG. 2. It suffices that one of the MOS elements should conduct, i.e., that points $G_{11}$ or $G_{21}$ should be at a zero potential to obtain $-V$ at point $G_2$. The presence of the information 0 at one input results in the presence of this information 1 at the output.

Figure 7:
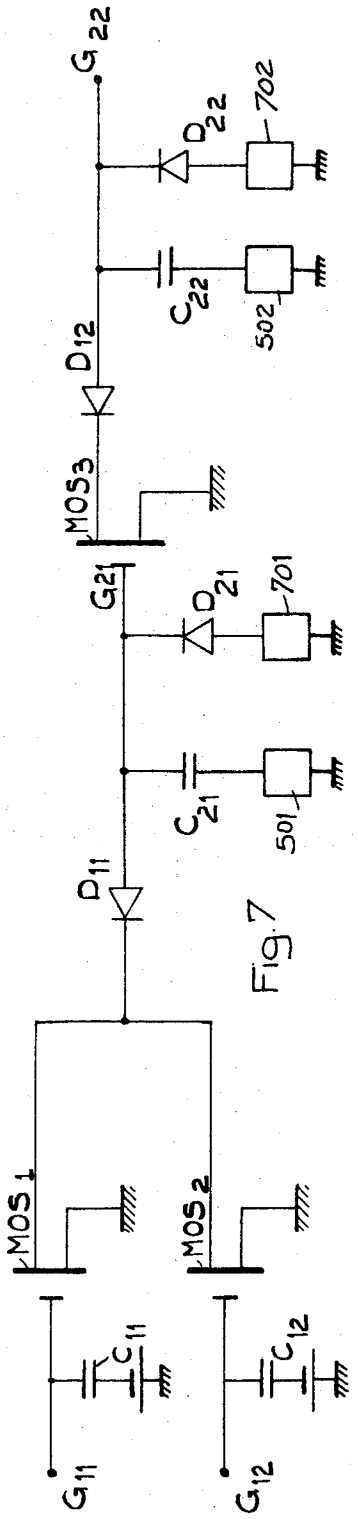

FIG. 7 represents an OR circuit. This circuit is developed from that of FIG. 6 by adding a third circuit comprising an $MOS_3$ element, identical to that of FIG. 2. The pulse generators are 501, 701, 502, 702.

An information present at $G_{11}$ or $G_{12}$ is found at $G_{21}$, and can be made available at $G_{22}$.

Figure 8:
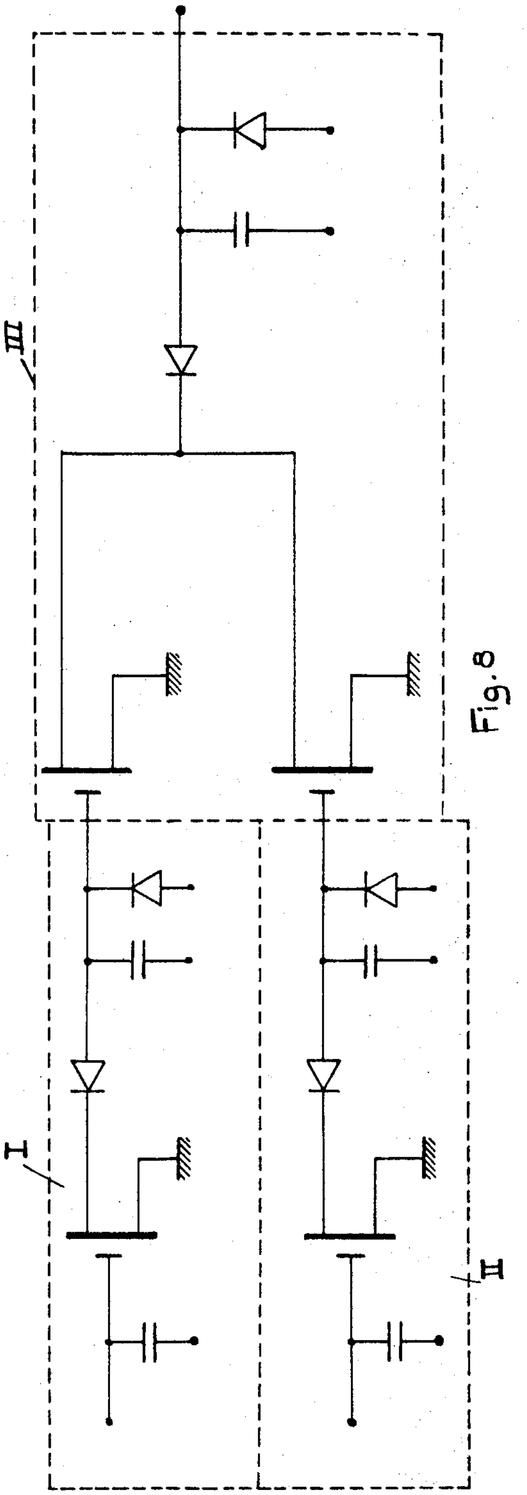

FIG. 8 shows an AND circuit. The same consists of a circuit III such as that shown in FIG. 6, to the inputs of which are connected two circuits I and II, such as shown in FIG. 2.

Figure 9:
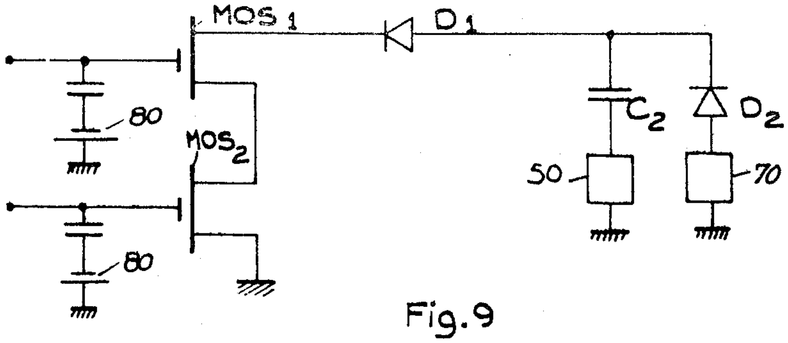

The circuit of FIG. 9 is a NOR circuit. It comprises two elements $MOS_1$ and $MOS_2$ in series between earth and the diode $D_1$.

The absence of information in the assembly prevents any conduction of the group $MOS_1$, $MOS_2$. Conduction takes place only if there is an information at the two elements.

Figures 10, 11:
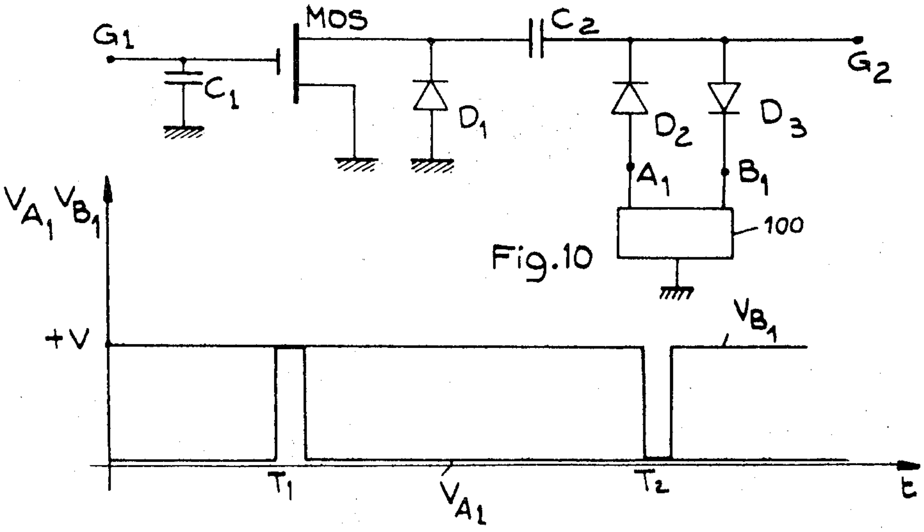
FIGS. 10 and 12 represent, respectively, two embodiments of transfer elements according to the invention.
FIG. 11 is an explanatory curve.

FIG. 10 shows a so-called transfer element. It comprises an input $G_1$ and an output $G_2$.

The input $G_1$ is connected to the gate of an $MOS_1$ element, the source of which is earthed. A diode $D_1$ is mounted in bridge circuit between the drain and the source. It conducts in the direction from the earth to the drain.

A capacitor $C_2$ connects the drain to the output $G_2$. Two points $A_1$ and $B_1$ are connected between the point $G_2$ and a pulse generator 100 by two diodes, $D_2$ and $D_3$, respectively. Diode $D_2$ is in the same direction as $D_1$, diode $D_3$ in the opposite sense.

The operation of the arrangement may be understood with reference to FIG. 11, which is concerned with an "enhancement" type element.

Point $A_1$ is normally at zero potential and pulse source 100 applies thereto pulse with the crest $+V$ at the moment $T_1$. Two cases may occur:

(a) At the moment $T_1$, the potential of point $G_1$ is $+V$, and the MOS element is conducting. The capacitor $C_2$ is charged by the pulse passing through the diode $D_2$, the capacitor $C_1$ and the MOS element. Point $G_2$ assumes the potential $+V$.

(b) The potential of $G_1$ is zero. The MOS element does not conduct. The capacitor $C_2$ is not charged. Its potential remains zero.

At the moment $T_2$, a negative pulse discharges the capacitor $C_2$. The diode $D_1$ fixes the potential of the armature of the capactior $C_1$, connected to the MOS element when the latter is blocked. This diode can be incorporated into the MOS element. In this case, it is formed by the junction between the drain and the body of the semiconductor.

In this drawing, an enhancement type element has been used. In the case of a depletion type element, it is sufficient to offset the voltage at $A_1$ and $B_1$ by a fixed value corresponding to the used element.

Figure 12:
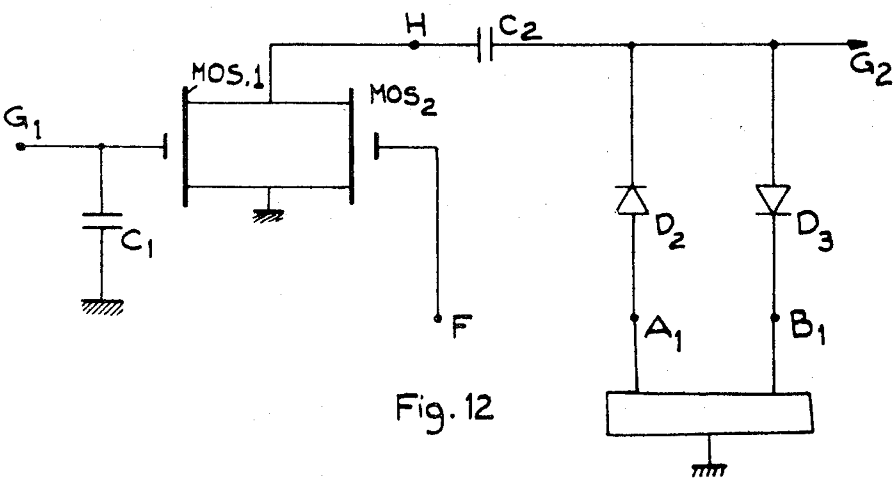

A modification is shown in FIG. 12. In this diagram, the diode $D_1$ has been replaced by an element $MOS_2$, blocked during the positive pulse applied at $A_1$ and conducting during the remainder of the time. To this end, the gate of the element is connected to a point F held at a suitable potential. The source and the drain of the $MOS_2$ element are connected, respectively, to the source and to the drain of the $MOS_1$ element. Owing to the presence of the $MOS_2$ element, the input impedance of the unit, as seen from the point H, is low, which facilitates the setting up of a sequence of elements. If, in fact the junction point of two consecutive elements is at the point H, the danger of deterioration by leakage currents is eliminated.

It has thus been shown that, due to the circuits of FIGS. 10 and 12, the voltage at point $G_1$ is transported to point $G_2$ after the application of the control pulse. This is the reason why such circuits are designated as transfer circuits. They can be used in making shift registers.

Figure 13:
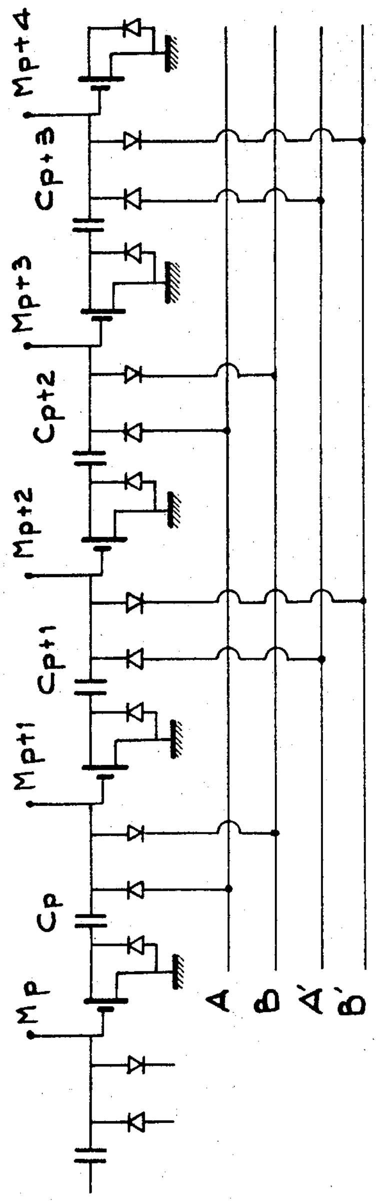
FIG. 13 shows an embodiment of a shift register according to the invention.

The shift register of FIG. 13 comprises a number of stages, some of which are shown in FIG. 13 at $M_p$ to $M_{p+4}$. Each of these stages is identical to the circuit shown in FIG. 10.

The output $M_p$ of each of these stages is the input of the next stage.

A clock, not shown, supplies four distribution points A, B, and A', B'.

The pulses for charging and discharging the capacitors $C_p$, $C_{p+2}$ are delivered, respectively, by the points A, B. The pulses for charging and discharging the capacitors $C_{p+1}$ and $C_{p+3}$ are delivered by the points A', B', respectively.

Figure 14:
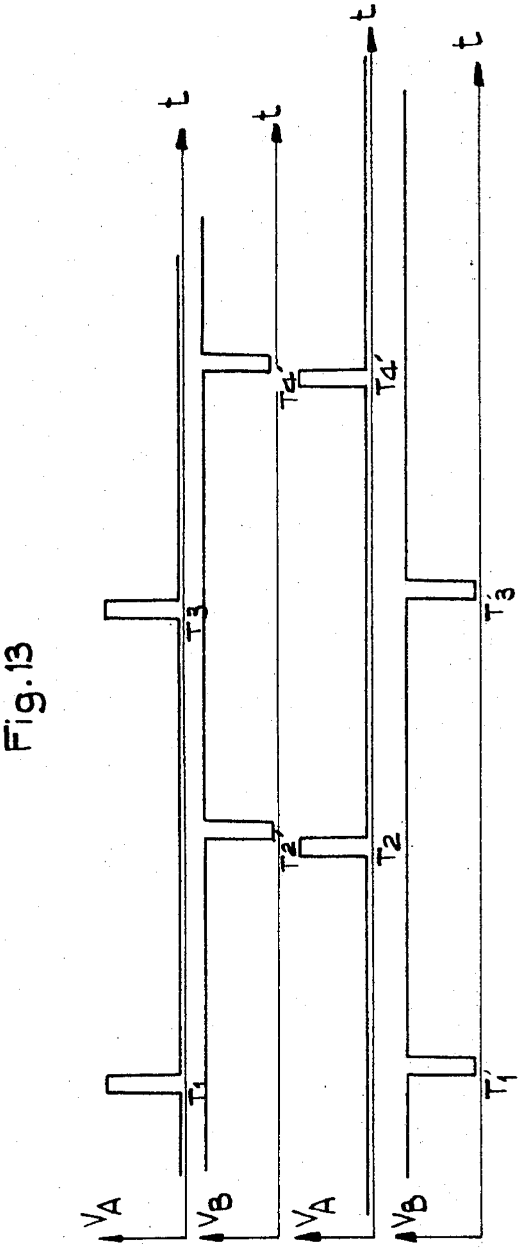
FIG. 14 is a curve explaining FIG. 13.

The voltages at A, A′, B, B′ are represented in FIG. 14.

The capacitors $C_p$, $C_{p+2}$ are charged at the time $T_1$, $T_3$.

The capacitors $C_{p+1}$, $C_{p+3}$ are charged at the time $T_2$,$T_4$.

The discharges take place, respectively, at the time $T'_1$, $T'_3$ and $T'_2$, $T'_4$.

The instants $T_k$ and $T'_k$ are offset in time by the width of one pulse. The control voltages of the register are recovered at the points $M_p$ . . . . At the start, all voltages are zero, with the exception of one which is equal to V.

The voltage +V progresses at every sequence of pulses of the clock from $M_p$ to $M_{p+1}$.

Thus, at a given instant, only one gate is open, except during the switching periods.

Of course, the invention is not limited to the embodiments described and shown which were given solely by way of examples.

What is claimed, is:

1. A logical circuit element comprising at least one field effect transistor of the meal oxide semiconductor (MOS) type, having a source, a drain and a gate; an input for receiving signals connected to said gate, for blocking or unblocking said transistor; an input capacitor connected between said input and said source; an output terminal, means for connecting said output terminal to said drain, output capacitance means connected to said output terminal; a first pulse generator connected to said output capacitance means and a first diode in series between said drain and said source, for preventing the discharge of said output capacitance means across said MOS, when conductng.

2. A logical circuit as claimed in claim 1, wherein said output capacitance means is a capacitor.

3. A logical circuit element as claimed in claim 2, wherein said first diode is connected in series between said output terminal and said drain.

4. A logical circuit element as claimed in claim 3, further comprising means for connecting a source of voltage between said source and said input capacitor; a second positive pulse generator and a second diode for conducting said second positive pulses connected in series between a source of negative D.C. potential and said output terminal, said second positive pulses having the amplitude of said negative D.C. voltage.

5. A logical circuit element as claimed in claim 4, further comprising a second MOS transistor, having its drain source circuit connected in series to said source; said second MOS having a second input terminal, a second gate connected to said second input terminal, and a second input capacitor connected to said second gate, and means for connecting a second source of D.C. potential between said second input capacitor and said second source.

6. A logical circuit element as claimed in claim 2, wherein said first pulse generator and said first diode are series connected between said source and said drain, further comprising: a third pulse generator for generating third pulses of the same amplitude and of the opposite polarity to that of said first pulses, at the same instants as said first pulses, and a third diode for passing said third pulses to said source, and a fourth pulse generator for generating fourth pulses of the same polarity as said third pulses, and a fourth diode for passing said pulses to said drain, said output capacitor being connected between said source and drain.

7. A logical circuit element as claimed in claim 2, wherein said output capacitor is series connected between said drain and said output terminal; an eleventh diode being connected between said drain and said source, for conducting the current between said source and said drain, a twelfth diode and said first diode being oppositely mounted, and connected to said output terminal; said first pulse generator and a twelfth pulse generator for generating pulses of a polarity opposite to that of said first pulses, being connected to said first diode and said twelfth diode respectively.

8. A logical circuit as claimed in claim 7, further comprising a second MOS having second drain and source parallely connected with said drain and source of said first MOS, and a second gate, connected to a fixed potential.

9. A plurality of circuits as claimed in claim 8, cascade connected, the input terminal of one circuit being connected to the output terminal of the following one, and means for applying successive pulses to said input terminals of said circuits in succession.

10. A logical circuit element as claimed in claim 1 further comprising a second transistor having a second input terminal, a second gate connected to said second input terminal, a second input capacitor connected between said second gate and second source, a second drain connected to said drain and a second source connected to said source.

11. A logical circuit as claimed in claim 10, further comprising a third MOS transistor having a gate connected to said output terminal, a further output terminal, a source and a drain, a further output capacitor, a seventh positive pulse generator for applying seventh positive pulses to said further output capacitor, and a seventh diode, said seventh diode and said further capacitor being connected in series to said drain; an eighth pulse generator for applying eighth positive pulses to said further output terminal and an eighth diode for passing said last mentioned pulses.

12. A logical circuit as claimed in claim 10, further comprising a fifth and a fourth MOS transistor, having further respective input terminals and respective gates connected respectively to said further respective input terminals, a ninth positive pulse generator for applying positive pulses to said output capacitor, a ninth diode for passing said pulses to said source, a tenth positive pulse generator for applying pulses to said gate of said fifth and sixth MOS transistor, and a tenth diode for passing said pulses.

References Cited

UNITED STATES PATENTS

| | | | |
|---|---|---|---|
| 3,252,009 | 5/1966 | Weimer | 307—221 |
| 3,373,295 | 3/1968 | Lambert | 307—304 X |

DONALD D. FORRER, Primary Examiner

B. P. DAVIS, Assistant Examiner

U.S. Cl. X.R.

307—208, 221, 251, 304